(12) United States Patent
Juengling et al.

(10) Patent No.: US 7,112,542 B2
(45) Date of Patent: Sep. 26, 2006

(54) METHODS OF FORMING MATERIALS BETWEEN CONDUCTIVE ELECTRICAL COMPONENTS, AND INSULATING MATERIALS

(75) Inventors: Werner Juengling, Boise, ID (US); Kirk D. Prall, Boise, ID (US); Ravi Iyer, Boise, ID (US); Gurtej S. Sandhu, Boise, ID (US); Guy Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/330,719

(22) Filed: Dec. 27, 2002

(65) Prior Publication Data

US 2003/0134503 A1 Jul. 17, 2003

Related U.S. Application Data (60) Division of application No. 09/976,624, filed on Oct. 12, 2001, now Pat. No. 6,812,160, which is a continuation of application No. 09/115,339, filed on Jul. 14, 1998, now Pat. No. 6,313,046, which is a division of application No. 08/947,847, filed on Oct. 9, 1997, now Pat. No. 6,333,556.

(51) Int. Cl.
*H01L 21/31* (2006.01)
*H01L 21/469* (2006.01)
*H01L 21/76* (2006.01)

(52) U.S. Cl. .................... 438/782; 438/421
(58) Field of Classification Search ........... 438/619, 438/623, 624, 782, 631, 639, 421
See application file for complete search history.

(56) References Cited

U.S. PATENT DOCUMENTS 3,767,490 A * 10/1973 Alberts ................. 216/58

(Continued)

FOREIGN PATENT DOCUMENTS

EP 0 542 262 A1 5/1993

(Continued)

OTHER PUBLICATIONS

Wolf, et al. Silicon Processing for the VLSI Era, vol. 1-Process Technology, Lattice Press: Sunset Beach CA, 1986, pp. 428-429.*

(Continued)

*Primary Examiner*—Carl Whitehead, Jr.
*Assistant Examiner*—Heather Doty
(74) *Attorney, Agent, or Firm*—Wells St. John P.S.

(57) ABSTRACT

Methods of forming insulating materials between conductive elements include forming a material adjacent a conductive electrical component comprising: partially vaporizing a mass to form a matrix adjacent the conductive electrical component, the matrix having at least one void within it. Other methods include forming a material between a pair of conductive electrical components comprising: forming a pair of conductive electrical components within a mass and separated by an expanse of the mass; forming at least one support member within the expanse of the mass, the support member not comprising a conductive interconnect; and vaporizing the expanse of the mass to a degree effective to form at least one void between the support member and each of the pair of conductive electrical components. Some embodiments include an insulating material adjacent a conductive electrical component, such material comprising a matrix and at least one void within the matrix.

15 Claims, 6 Drawing Sheets

U.S. PATENT DOCUMENTS

| | | |
|---|---|---|
| 3,919,060 A | 11/1975 | Pogge et al. |
| 3,954,523 A | 5/1976 | Magdo et al. |
| 3,979,230 A | 9/1976 | Anthony et al. |
| 3,998,662 A | 12/1976 | Anthony et al. |
| 4,063,901 A | 12/1977 | Shiba |
| 4,180,416 A | 12/1979 | Brock |
| 4,561,173 A | 12/1985 | Te Velde |
| 4,572,848 A | 2/1986 | Pollak et al. |
| 4,843,034 A | 6/1989 | Herndon et al. |
| 5,023,200 A | 6/1991 | Blewer et al. |
| 5,061,514 A | 10/1991 | Boeglin |
| 5,103,288 A | 4/1992 | Sakamoto et al. |
| 5,141,896 A | 8/1992 | Katoh |
| 5,149,615 A | 9/1992 | Chakravorty et al. |
| 5,165,991 A | 11/1992 | Fukuda et al. |
| 5,171,713 A | 12/1992 | Matthews |
| 5,192,834 A | 3/1993 | Yamanishi et al. |
| 5,266,519 A | 11/1993 | Iwamoto |
| 5,286,668 A | 2/1994 | Chou |
| 5,298,311 A | 3/1994 | Bentson et al. |
| 5,380,511 A | 1/1995 | Arahori et al. |
| 5,380,679 A | 1/1995 | Kano |
| 5,461,003 A * | 10/1995 | Havemann et al. ......... 438/666 |
| 5,464,786 A | 11/1995 | Figura et al. |
| 5,466,617 A | 11/1995 | Shannon |
| 5,470,801 A | 11/1995 | Kapoor et al. |
| 5,488,015 A | 1/1996 | Havemann et al. |
| 5,494,858 A | 2/1996 | Gnade et al. |
| 5,496,773 A | 3/1996 | Rhodes et al. |
| 5,510,645 A * | 4/1996 | Fitch et al. ................ 257/522 |
| 5,525,857 A | 6/1996 | Gnade et al. |
| 5,527,737 A | 6/1996 | Jeng |
| 5,543,346 A * | 8/1996 | Keum et al. ................ 438/397 |
| 5,554,567 A | 9/1996 | Wang |
| 5,559,666 A | 9/1996 | Figura et al. |
| 5,583,078 A | 12/1996 | Osenbach |
| 5,599,745 A | 2/1997 | Reinberg |
| 5,629,238 A | 5/1997 | Choi et al. |
| 5,654,224 A | 8/1997 | Figura et al. |
| 5,670,828 A | 9/1997 | Cheung et al. |
| 5,674,787 A | 10/1997 | Zhao et al. |
| 5,691,565 A | 11/1997 | Manning |
| 5,691,573 A | 11/1997 | Avanzino et al. |
| 5,723,368 A | 3/1998 | Cho et al. |
| 5,736,425 A | 4/1998 | Smith et al. |
| 5,736,459 A | 4/1998 | Tseng |
| 5,744,399 A | 4/1998 | Rostoker et al. |
| 5,750,415 A | 5/1998 | Gnade et al. |
| 5,773,363 A | 6/1998 | Derderian et al. |
| 5,804,508 A | 9/1998 | Gnade et al. |
| 5,807,607 A | 9/1998 | Smith et al. |
| 5,808,854 A | 9/1998 | Figura et al. |
| 5,847,443 A | 12/1998 | Cho et al. |
| 5,858,871 A | 1/1999 | Jeng |
| 5,861,345 A | 1/1999 | Chou et al. |
| 5,882,978 A | 3/1999 | Srinivasan et al. |
| 5,883,014 A | 3/1999 | Chen et al. |
| 5,950,102 A | 9/1999 | Lee |
| 5,967,804 A | 10/1999 | Yoshizawa et al. |
| 5,970,360 A | 10/1999 | Cheng et al. |
| 5,981,085 A | 11/1999 | Ninomiya et al. |
| 6,001,747 A | 12/1999 | Annapragada |
| 6,008,540 A | 12/1999 | Lu et al. |
| 6,028,015 A | 2/2000 | Wang et al. |
| 6,039,847 A | 3/2000 | Chayahara et al. |
| 6,143,645 A | 11/2000 | Hsu et al. |
| 6,156,374 A | 12/2000 | Forbes et al. |
| 6,184,572 B1 | 2/2001 | Mountsier et al. |
| 6,204,172 B1 | 3/2001 | Marsh |
| 6,207,583 B1 | 3/2001 | Dunne et al. |
| 6,245,439 B1 | 6/2001 | Yamada et al. |
| 6,251,470 B1 | 6/2001 | Forbes |
| 6,271,146 B1 | 8/2001 | Ross |
| 6,313,046 B1 | 11/2001 | Juengling et al. |
| 6,319,852 B1 | 11/2001 | Smith et al. |
| 6,333,556 B1 | 12/2001 | Juengling |
| 6,347,446 B1 | 2/2002 | Luthra et al. |
| 6,350,679 B1 | 2/2002 | McDaniel et al. |
| 6,351,039 B1 | 2/2002 | Jin et al. |
| 6,448,187 B1 | 9/2002 | Yau et al. |
| 6,495,458 B1 | 12/2002 | Marsh |
| 6,589,887 B1 | 7/2003 | Dalton et al. |

FOREIGN PATENT DOCUMENTS

| | | |
|---|---|---|
| EP | 0 923 125 A1 | 6/1999 |
| EP | 0923125 A1 | 6/1999 |

OTHER PUBLICATIONS

J. H. Lee et al., "Fabrication of Surface Micromachined Polysilicon Actuators Using Dry Release Process of HF Gas-Phase Etching" International Electron Devices Meeting, San Francisco, CA, 1996, IEDM 96, pp. 761-764.*

Togo, M., "A Gate-side Air-gap Structure (GAS) to Reduce the Parasitic Capacitance in MOSFETs", 1996 Sympos. on VLSI Technology Digest of Technical Papers, IEEE 1996, pp. 38-39.

Anand, M.B., "NURA: A Feasible, Gas-Dielectric Interconnect Process", 1996 Sympos. on VLSI Technology Digest of Technical Papers, IEEE 1996, pp. 82-83.

Abstract: Anderson, R.C. et al., "Porous Polycrystalline Silicon: A New Material For MEMS", Jnl. of Microelectromechanical Systems (Mar. 1994), vol. 3, No. 1, pp. 10-18.

Peter Singer (Editor-in-Chief); "The New Low-k Candidate: It's a Gas"; Technology News, Mar. 1989; 1 page.

Stanley Wolf Ph.D., Silicon Processing for the VLSI Era, (c) 1986, pp. 1-8.

Stanley Wolf Ph.D., Silicon Processing for the VLSI Era, (c) 1986, pp. 429-437.

Watanabe, H., "A Novel Stacked Capacitor with Porous-Si Electrodes for High Density DRAMs", 1993 Symposium on VLSI Technology, Digest of Technical Papers, Kyoto Japan, 17-18, 1993. Year is sufficiently early so that the month is not an issue.

P. Townsend et al., "SiLK Polymer Coating with Low Dielectric Constant and High Thermal Stability for VLSI Interlayer Dielectric", Proceedings Materials Research Society San Francisco, CA, Apr. 1997, vol. 476, pp. 9-17.

Product Brochure and Material Safety Data Sheet, "Interlayer Dielectric", *JSR Microelectronics*, 12 Pages (1997). Year is sufficiently early so that the month is not an issue.

Gayes, et al., Translation of EP 0923125 A1, "Process For Making Metal Interconnections In Integrated Circuits," Jun. 1999.

* cited by examiner

METHODS OF FORMING MATERIALS BETWEEN CONDUCTIVE ELECTRICAL COMPONENTS, AND INSULATING MATERIALS

RELATED PATENT DATA

This patent resulted from a divisional application of U.S. patent application Ser. No. 09/976,624, filed on Oct. 12, 2001, now U.S. Pat. No. 6,812,106, which is a continuation application of U.S. patent application Ser. No. 09/115,339 filed on Jul. 14, 1998, now U.S. Pat. No. 6,313,046; which is a divisional application of U.S. patent application Ser. No. 08/947,847 filed on Oct. 9, 1997, now U.S. Pat. No. 6,333,556.

TECHNICAL FIELD

The invention pertains to methods of forming material adjacent electrical components and to methods of forming material between conductive electrical components. The invention further pertains to insulating materials formed adjacent or between conductive electrical components.

BACKGROUND OF THE INVENTION

Figure 1:
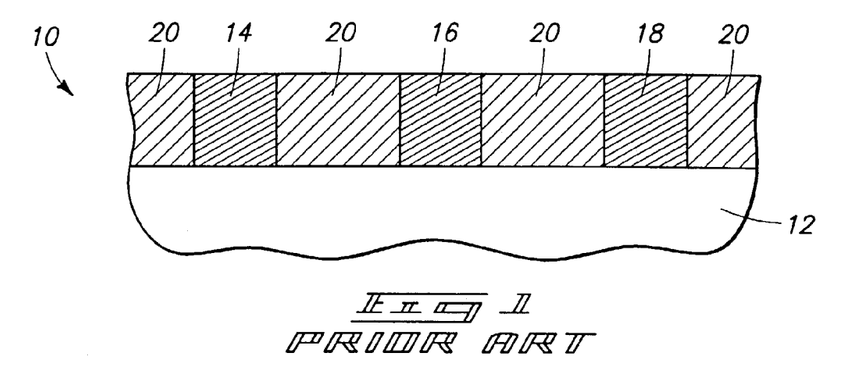
FIG. 1 is a diagrammatic cross-sectional view of a prior art semiconductor wafer fragment.

A prior art semiconductor wafer fragment 10 is illustrated in FIG. 1. Wafer fragment 10 comprises a substrate 12 and conductive electrical components 14, 16 and 18 overlying substrate 12. Conductive electrical components 14, 16 and 18 may comprise, for example, conductive lines. Such conductive lines may be formed from metal, or conductively-doped polysilicon. Between conductive components 14, 16 and 18 is formed an insulative material 20. Material 20 electrically isolates conductive elements 14, 16 and 18 from one another. Insulative material 20 may comprise materials known to persons of ordinary skill in the art:, including, for example, silicon dioxide, silicon nitride, and undoped silicon. Although each of these materials has good insulative properties, the materials disadvantageously have high dielectric constants which can lead to capacitive coupling between proximate conductive elements, such as elements 14, 16 and 18. For instance, silicon nitride has a dielectric constant of about 8 and undoped silicon has a dielectric constant of about 11.8.

Figure 2:
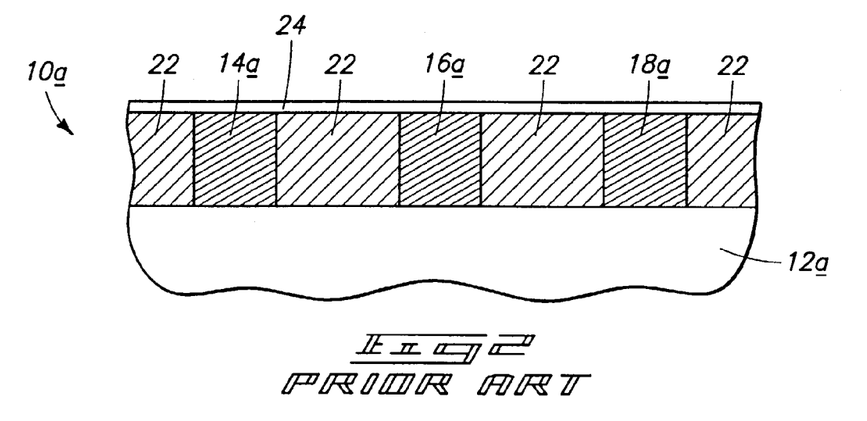
FIG. 2 is a diagrammatic cross-sectional view of a semiconductor wafer fragment at a preliminary step of a prior art processing method.
Figure 3:
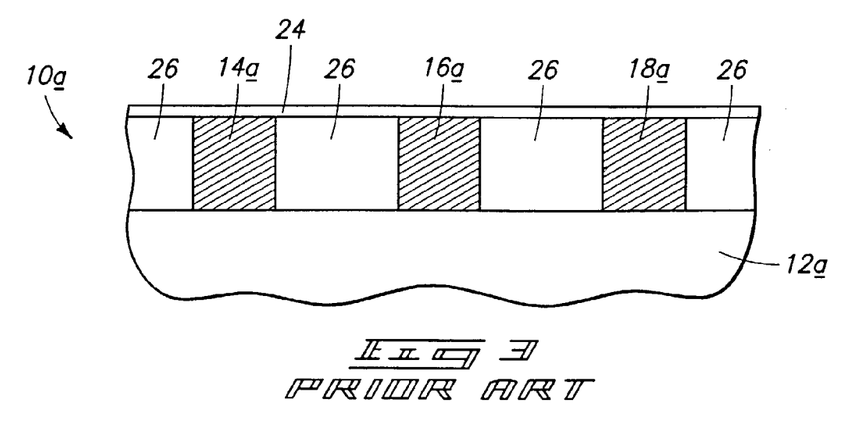
FIG. 3 is a view of the FIG. 2 wafer fragment at a prior art processing step subsequent to that of FIG. 2.

A prior art method for insulating conductive elements 14, 16 and 18 from one another, while reducing a dielectric constant of a material between conductive elements 14, 16 and 18 is illustrated in FIGS. 2 and 3. In referring to FIGS. 2 and 3, similar numbers to those utilized in FIG. 1 will be used, with differences indicated by the suffix "a" or by different numerals.

Referring to FIG. 2, a semiconductor wafer fragment 10a is illustrated. Fragment 10a comprises a substrate 12a, and overlying conductive lines 14a, 16a and 18a. Between lines 14a, 16a and 18a is a carbon layer 22. Conductive lines 14a, 16a and 18a are inlaid within carbon layer 22 by a damascene method. A thin gas-permeable, silicon dioxide layer 24 is formed over conductive lines 14a, 16a and 18a, and over carbon layer 22.

Referring to FIG. 3, carbon layer 22 is vaporized to form voids 26 between conductive elements 14a, 16a and 18a. Voids 26 contain a gas. Gasses advantageously have: dielectric constants of about 1.

It would be desirable to develop alternative methods for insulating conductive elements from one another with low-dielectric-constant materials.

SUMMARY OF THE INVENTION

The invention encompasses methods of forming insulating materials between conductive elements. The invention pertains particularly to methods utilizing low-dielectric-constant materials for insulating conductive elements, and to structures encompassing low-dielectric-constant materials adjacent or between conductive elements.

In one aspect, the invention encompasses a method of forming a material adjacent a conductive electrical component. The method includes providing a mass adjacent the conductive electrical component and partially vaporizing the mass to form a matrix adjacent the conductive electrical component. The matrix can e at least one void within it.

In another aspect, the invention encompasses a method of forming a material adjacent a conductive electrical component which includes providing a mass comprising polyimide or photoresist adjacent the conductive electrical component. The method further includes at least partially vaporizing the mass.

In another aspect, the invention encompasses a method of forming a material between a pair of conductive electrical components. The method includes forming at least one support member between the pair of conductive electrical components. The method further includes providing a mass between the at least one support member and each of the pair of conductive electrical components. Additionally, the method includes vaporizing the mass to a degree effective to form at least one void between the support member and each of the pair of conductive electrical components.

In yet another aspect, the invention encompasses an insulating material adjacent a conductive electrical component. The insulating material comprises a matrix and at least one void within the matrix.

In yet another aspect, the invention encompasses an insulating region between a pair of conductive electrical components. The insulating region comprises a support member between the conductive electrical components, the support member not comprising a conductive interconnect. The insulating region further comprises at least one void between the support member and each of the pair of conductive electrical components.

BRIEF DESCRIPTION OF THE DRAWINGS

Preferred embodiments of the invention are described below with reference to the following accompanying drawings.

FIG. 14 is a diagrammatic cross-sectional view of a semiconductor wafer fragment processed according to a sixth embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first embodiment of the present invention is described with reference to FIGS. 4–6. In describing the first embodiment, like numerals from the preceding discussion of the prior art are utilized where appropriate, with differences being indicated by the suffix "b" or by different numerals.

Figure 4:
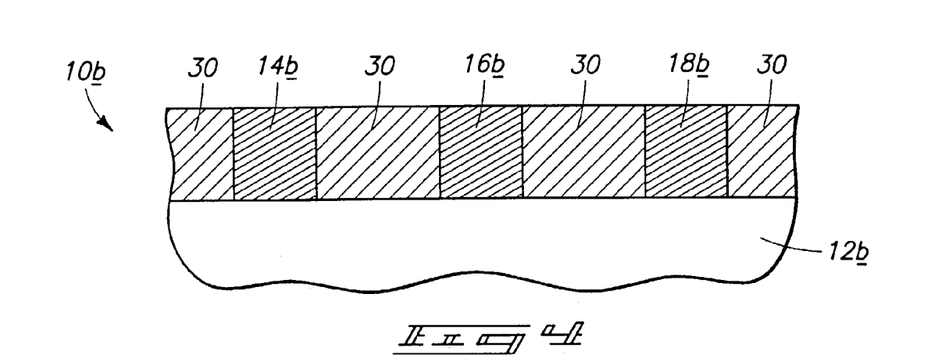
FIG. 4 is a diagrammatic cross-sectional view of a semiconductor wafer fragment at a preliminary step of a processing method of the present invention.

Referring to FIG. 4, a semiconductor wafer fragment 10b is illustrated. Semiconductor wafer fragment 10b comprises a substrate 12b, and conductive elements 14b, 16b and 18b overlying substrate 12b. Conductive elements 14b, 16b and 18b may comprise, for example, conductive lines. Substrate 12b may comprise, for example, an insulative layer over a semiconductive substrate.

Electrical components 14b, 16b and 18b are horizontally displaced from one another, with electrical components 14b and 18b being laterally outwardly displaced from component 16b. A mass 30 is between electrical components 14b and 16b, and between electrical components 16b and 18b. Mass 30 is also outwardly adjacent outer conductive elements 14b and 18b.

Mass 30 is preferably an insulative material and may comprise, for example, carbon. Alternatively, by way of example only, mass 30 can comprise polyimide or photoresist. In yet other alternative aspects of the invention, mass 30 can comprise a mixture or a material which is substantially non-vaporizable under selected conditions, and a material which is substantially vaporizable under the selected conditions. Accordingly, complete vaporization of the substantially vaporizable material under the selected conditions will only partially vaporize mass 30. As an example, mass 30 can comprise a mixture of carbon and silicon dioxide. As another example, mass 30 can comprise a mixture of carbon and $SiC_x$. Preferably, if mass 30 comprises $SiC_x$, "x" will be from about 0.2 to about 1.5. More preferably, if mass 30 comprises a mixture of carbon and $SiC_x$, mass 30 will comprise a mixture from about 20% to about 80% carbon, by volume, and from about 80% to 20% $SiC_x$, by volume, wherein "x" is from about 0.2 to about 1.5.

As will be recognized by persons of ordinary skill in the art, the construction of FIG. 4 may be formed by a number of different methods. For instance, conductive elements 14b, 16b and 18b could be formed first, and mass 30 subsequently deposited over and between conductive elements 14b, 16b and 18b. Mass 30 could then be planarized to a level approximately equal with upper surfaces of conductive elements 14b, 16b and 18b.

As another example, mass 30 could be deposited between an adjacent conductive lines 14b, 16b and 18b, without being deposited over conductive lines 14b, 16b and 18b.

In yet another example, mass 30 could first be formed over substrate 12b, and subsequently conductive elements 14b, 16b and 18b could be formed within mass 30 by a damascene method. Conductive electrical components 14b, 16b and 18b would thereby effectively be formed within an expanse of mass 30.

If mass 30 comprises carbon, the carbon may be deposited by plasma decomposition of $C(n)H(2n)$ or $C(n)H(2n)X(n)$, wherein "X" is a halogen such as Br, Cl, I, etc. The deposited carbon is preferably about 10,000 Angstroms thick and can be porous. Porosity of a deposited carbon layer can be adjusted by adjusting deposition parameters, such as, plasma power, temperature, pressure, etc.

Figure 5:
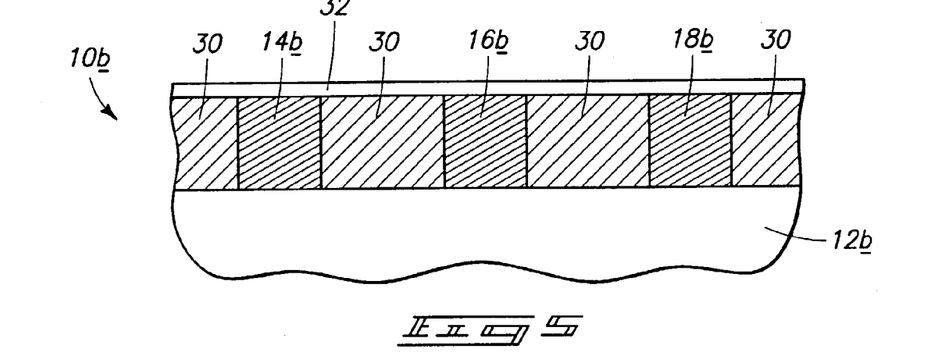
FIG. 5 is a view of the FIG. 4 wafer fragment shown at a processing step subsequent to that of FIG. 4.

Referring to FIG. 5, a layer 32 is formed over mass 30, and over conductive elements 14b, 16b and 18b. Layer 32 preferably comprises a gas permeable insulative material and may comprise, for example, silicon dioxide. Layer 32 will preferably be relatively thin, such as about 500 Angstroms thick. If layer 32 comprises silicon dioxide, the layer may be formed, for example, by sputter deposition. As will be discussed below, mass 30 can be partially or substantially totally vaporized after provision of layer 32. Preferably, layer 32 and mass 30 comprise materials which permit mass 30 to be partially or substantially totally vaporized under conditions which do not vaporize layer 32.

Figure 6:
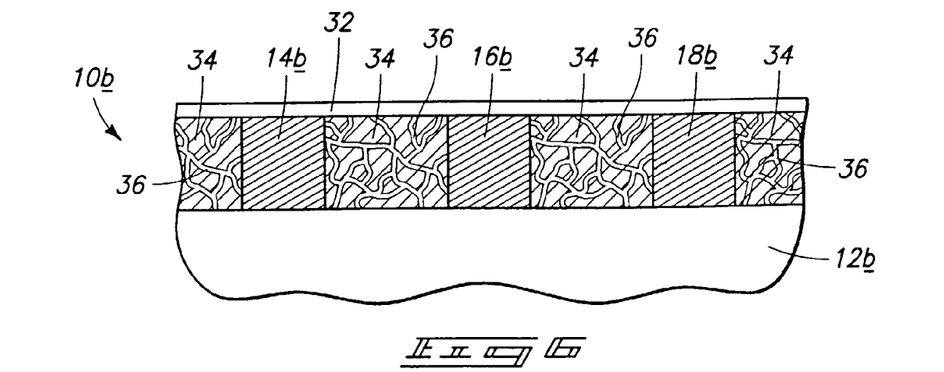
FIG. 6 is a view of the FIG. 4 wafer fragment shown at a step subsequent to that of FIG. 5.

Referring to FIG. 6, mass 30 (shown in FIG. 5) is partially vaporized to form a matrix 34 between conductive elements 14b, 16b and 18b. Matrix 34 is also formed outwardly adjacent outer conductive elements 14b and 18b. Matrix 34 can alternatively be referred to as a web, skeleton or scaffolding.

The partial vaporization of mass 30 (shown in FIG. 5) can be accomplished by exposing wafer fragment 10b to an oxidizing ambient at a temperature of from about 200° C. to about 400° C. Appropriate oxidizing ambients include, for example, $O_3$, plasma $O_3$, $H_2O_2$, plasma $H_2O_2$, combinations of $O_3$ and $H_2O_2$, and combinations of plasma $O_3$ and $H_2O_2$. It is thought that the partial vaporization of mass 30 occurs as excited oxygen atoms diffuse through material 32 and volatize material 34. For instance, if material 34 comprises carbon, the material will be converted into a gas comprising $CO_2$ and/or CO, which can diffuse out through layer 32.

Matrix 34 comprises voids 36. If pores were originally present in layer 30, such pores can expand as mass 30 is vaporized to form voids 36. Preferably, matrix 34 comprises at least one void 36 between each pair of conductive elements. Typically, matrix 34 will comprise a plurality of voids 36 between each pair of conductive elements. The voids and partially vaporized material of matrix 34 profile an insulative material between conductive lines 14b and 16b, and between conductive lines 16b and 18b, which preferably has a decreased dielectric constant relative to mass 30 (shown in FIG. 5). Accordingly, the conversion of mass 30 to partially vaporized matrix 34 can advantageously decrease capacitive coupling between paired conductive elements 14b and 16b, and between paired conductive elements 16b and 18b. Preferably, matrix 34 has a dielectric constant of less than or equal to about 2.

An advantage of the embodiment discussed above with reference to FIGS. 4–6, relative to the prior art method discussed in the "Background" section, is that matrix 34 provides a skeletal support structure in the embodiment of the present invention. Such skeletal support structure can assist in supporting layer 32 over an expanse between paired conductive elements 14b and 16b, and over an expanse between paired conductive elements 16b and 18b. Also, matrix 34 can assist in supporting layer 32 outwardly adjacent outer conductive elements 14b and 18b. Further, due to the supporting properties of matrix 34, layer 32 may be formed either before or after partial vaporization of mass 30 (shown in FIG. 5).

A second embodiment of the present invention is described with reference to FIGS. 7–8. In describing the second embodiment, like numerals from the preceding discussion of the first embodiment are utilized, with differences being indicated by the suffix "c" or with different numerals.

Figure 7:
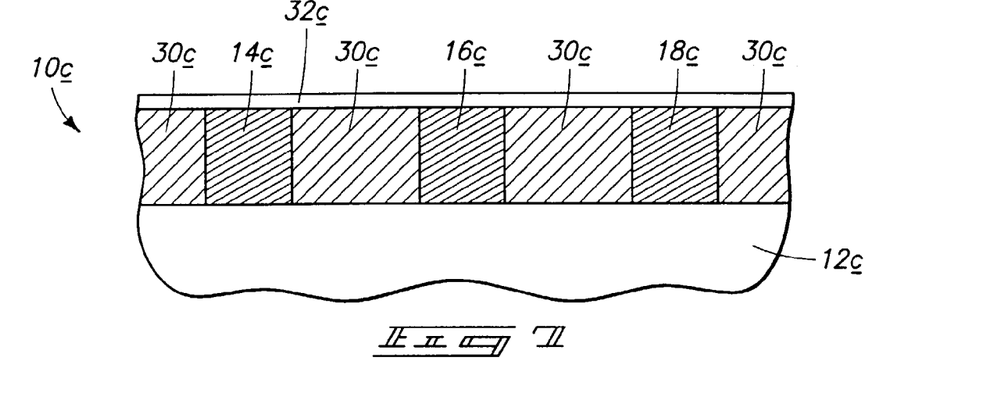
FIG. 7 is a diagrammatic cross-sectional view of a semiconductor wafer fragment at a preliminary processing step according to second embodiment of the present invention.

Referring to FIG. 7, a semiconductor wafer fragment 10c is illustrated. Wafer fragment 10c comprises a substrate 12c. Conductive electrical components 14c, 16c and 18c overlie substrate 12c. Electrical components 14c, 16c and 18c are horizontally displaced from one another, with electrical components 14c and 18c being outwardly displaced from component 16c. A mass 30c is between electrical components 14c and 16c, and between electrical components 16c and 18c. Mass 30c is also outwardly adjacent outer conductive elements 14c and 18c. Mass 30c does not comprise carbon, and preferably comprises either polyimide or photoresist. Substrate 12c may comprise, for example, an insulative material over a semiconductive wafer. Conductive elements 14c, 16c and 18c may comprise, for example, metal lines.

A layer 32c is formed over mass 30c, and over conductive elements 14c, 16c and 18c. Layer 32c preferably comprises an insulative material, and may comprise, for example, silicon dioxide. The structure of FIG. 7 is quite similar to the structure of FIG. 5, and may therefore be formed by methods such as those discussed above regarding FIG. 5, with the exception that mass 30c will not comprise carbon.

Figure 8:
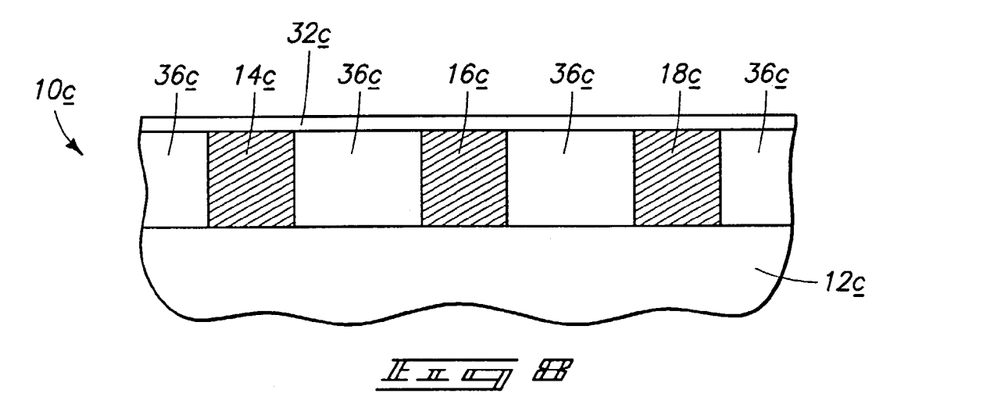
FIG. 8 is a view of the FIG. 7 wafer fragment shown at a step subsequent to that of FIG. 7.

Referring to FIG. 8, mass 30c (shown in FIG. 7) is substantially totally vaporized to form voids 36c between conductive elements 14c, 16c and 18c, and outwardly adjacent outer conductive elements 14c and 18c. Mass 30c can be substantially totally vaporized by exposing wafer 10c to an oxidizing ambient at a temperature of from about 200° C. to about 400° C. The difference between whether a mass such as mass 30 of FIG. 5, or mass 30c of FIG. 7, is partially vaporized (as shown in FIG. 6) or substantially totally vaporized (as shown in FIG. 8) can be determined by the time of exposure of a wafer fragment, such as 10b or 10c, to an oxidizing ambient at a temperature of from about 200° C. to about 400° C. Such times are readily determinable by persons of ordinary skill in the art.

The second embodiment of the present invention discussed above with reference to FIGS. 7 and 8) differs from the prior art method of discussed above in the Background section in that the second embodiment utilizes an insulative layer 30c which does not comprise carbon, such as a layer of photoresist or polyimide. Such use of photoresist or polyimide insulative layers offers distinct advantages over the prior art use of carbon insulative layers. For instance, while carbon is typically applied by vapor deposition techniques, polyimide and photoresist can be applied by spin-on-wafer techniques. Spin-on-wafer techniques enable the polyimide or photoresist to be applied with a relatively planar upper surface. Such planar upper surface can eliminate planarization processes from some applications of the present invention which would otherwise require planarization processes.

Also, spin-on-wafer techniques offer an advantage in that a solvent can be incorporated into a spin-on-wafer applied layer. Such solvent can be vaporized or otherwise removed from the applied layer during vaporization of the applied layer to increase the size or amount of voids formed within the applied layer. The amount of solvent incorporated into a spin on-wafer applied layer can be controlled by varying the amount and type of solvent utilized during a spin-on-wafer application of a layer. For instance, a first relatively volatile solvent and a second relatively non-volatile solvent could both be utilized during a spin-on-wafer application. The first solvent would largely evaporate from an applied layer during formation of the laser while the second solvent would substantially remain within the applied layer.

Figure 9:
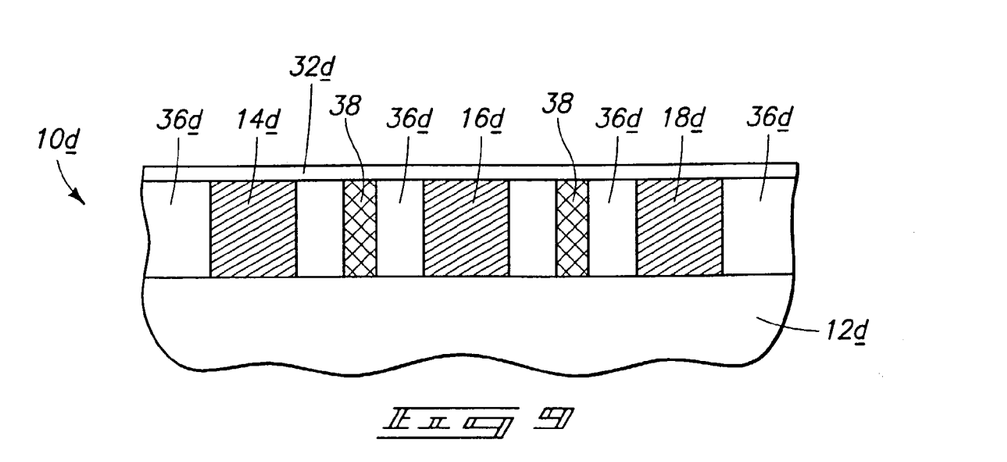
FIG. 9 is a diagrammatic cross-sectional view of a semiconductor wafer fragment processed according to a third embodiment of the present invention.

FIG. 9 illustrates a third embodiment of W present invention. In describing the third embodiment, like numerals from the preceding discussion of the second embodiment are utilized with differences being indicated by the suffix "d" or with different numerals.

Referring to FIG. 9, a wafer fragment 10d comprises a substrate 12d and conductive elements 14d, 16d and 18d overlying substrate 12d. A layer 32d overlies conductive elements 14d, 16d and 18d. Voids 36d are formed between conductive elements 14d, 16d and 18d. Voids 36d can be formed, for example by methods analogous to those discussed above with reference to FIGS. 7 and 8, or by methods utilizing substantially total vaporization of a carbon-comprising material.

Wafer fragment 10d further comprises support members 38 formed between conductive elements 14d and 16d, and between conductive elements 16d and 18d. Support members 38 can, advantageously assist in supporting layer 32d over the voids 36d between conductive elements 14d, 16d, and 18d. Support members 38 may comprise either insulative material or conductive material, but preferably do not comprise a conductive interconnect. Accordingly, support members 38 are preferably electrically isolated from conductive elements 14d, 16d and 18d, as well as from other conductive structures which may be comprised by an integrated circuit formed on wafer fragment 10d.

Support members 38 can be formed by methods readily apparent to persons of ordinary skill in the art. An example method comprises forming support members 38 between conductive elements 14d, 16d and 18d and subsequently forming a mass, such as mass 30 of FIG. 5 or mass 30c of FIG. 7 between the support members and conductive elements. Layer 32d could be then formed over the mass, over conductive elements 14d, 16d and 18d, and over support members 38. Next, the mass could be either partially or substantially totally vaporized to leave voids, such as voids 36d, between support members 38 and conductive elements 14d, 16d and 18d.

An alternative method of forming support members 38 would comprise forming the support members within an expanse of a mass, such as the mass 30 of FIG. 5, or the mass 30c of FIG. 7, by a damascene method.

It is noted that structure 38 may be utilized with either methods of partial vaporization of insulative materials, such as the method described with reference to FIGS. 4–6, or with methods of substantially total vaporization of insulative materials, such as the method discussed above with reference to FIGS. 7–8.

A fourth embodiment of the present invention is described with reference to FIGS. 10–12. In describing the fourth embodiment, like numerals from the preceding discussion of the first embodiment are utilized where appropriate, with differences being indicated with the suffix "e" or with different numerals.

Figure 10:
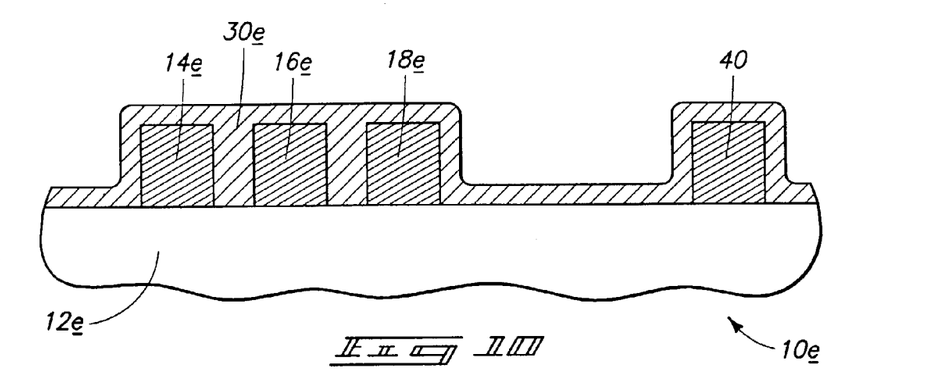
FIG. 10 is a diagrammatic cross-sectional view of a semiconductor wafer fragment at a preliminary step of a processing sequence according to a fourth embodiment of the present invention.

Referring to FIG. 10, a semiconductor wafer fragment 10e is illustrated. Wafer fragment 10e comprises a substrate 12e and conductive elements 14e, 16e, 18e and 40 overlying substrate 12e. A mass 30e is formed over conductive elements 14e, 16e, 18e and 40, as well as between the conductive elements. Mass 30e preferably comprises an insulative material, and can comprise materials such as those discussed above regarding mass 30 (shown in FIG. 4). Mass 30e extends entirely from conductive element 14e to conductive element 16e, entirely from conductive element 16e to conductive element 18e, and entirely from conductive element 18e to conductive element 40.

Figure 11:
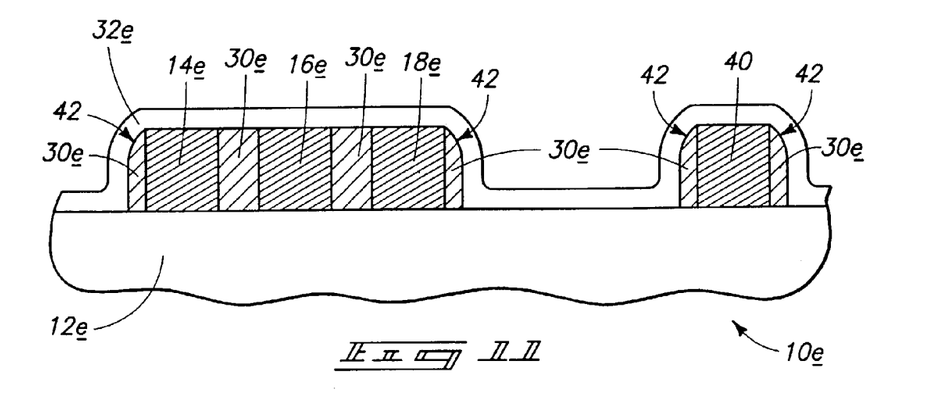
FIG. 11 is a view of the FIG. 10 wafer fragment shown at a processing step subsequent to that of FIG. 10.

Referring to FIG. 11, mass 30e is anisotropically etched to remove mass 30e from over conductive elements 14e, 16e, 18e and 40, and to remove mass 30e from between conductive elements 18e and 40. The anisotropic etching forms spacers 42 from mass 30e adjacent conductive element 40 and adjacent conductive elements 14e and 18e.

After the anisotropic, etching mass 30e extends entirely from conductive element 14e to conductive element 16e and entirely from conductive element 16e to conductive element 18e, but no longer extends entirely from conductive element 18e to conductive element 40.

As will be recognized by persons of ordinary skill in the art, methods for anisotropically etching mass 30e will vary depending on the chemical constituency of mass 30e. Such methods will be readily recognized by persons of ordinary skill in the art. An example method for anisotropically mass 30e when mass 30e comprises carbon is a plasma etch utilizing $O_2$.

A layer 32e is formed over spacers 42, over mass 30e, and over conductive elements 14e, 16e, 18e and 40. Layer 32e preferably comprises a material porous to gas diffusion, such as a silicon dioxide layer having a thickness of about 500 Angstroms or less.

Figure 12:
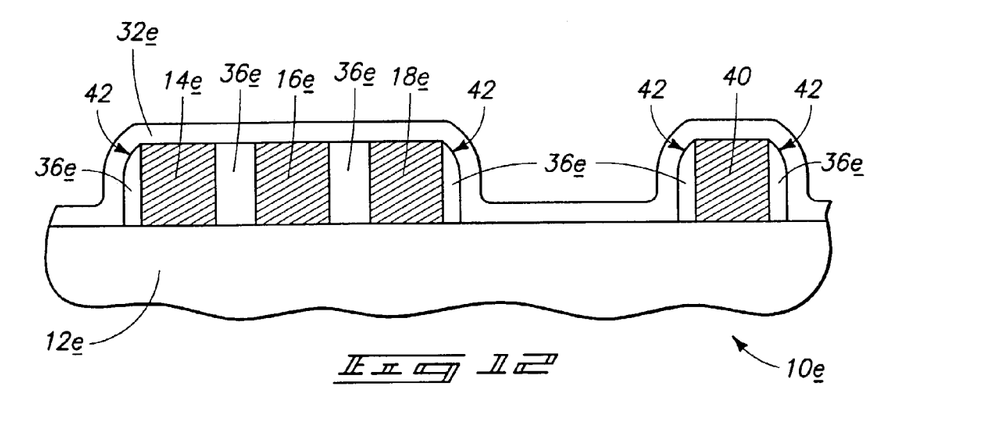
FIG. 12 is a view of the FIG. 10 wafer fragment shown at a processing step subsequent to that of FIG. 11.

Referring to FIG. 12, mass 30e (shown in FIG. 11) is substantially totally vaporized to form voids 36e. After such substantially total vaporization of mass 30e, spacers 42 comprise an insulative space. Methods for substantially totally vaporizing mass 30e can include methods discussed above with reference to FIGS. 8 and 9.

A fifth embodiment of the present invention is described with reference to FIG. 13. In describing the fifth embodiment, like numerals from the preceding discussion of the fourth embodiment are utilized where appropriate, with differences being indicated by the suffix "f" or by different numerals.

Figure 13:
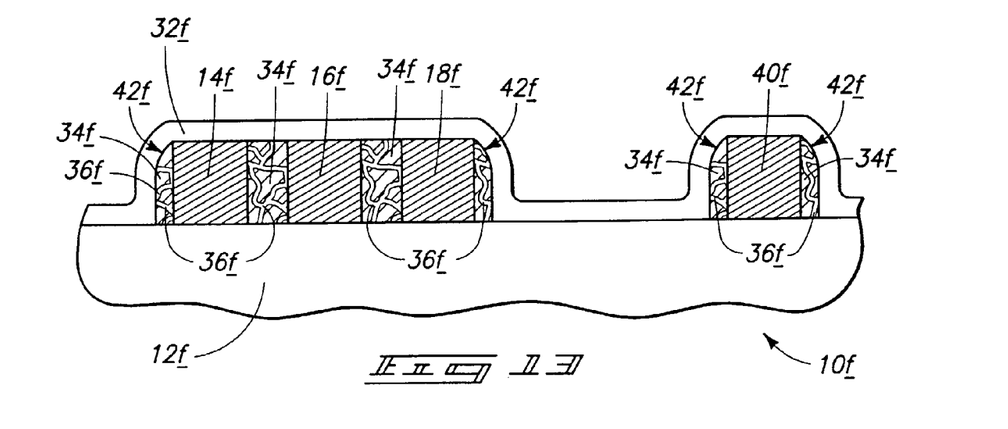
FIG. 13 is a diagrammatic cross-sectional view of a semiconductor wafer fragment processed according to a fifth embodiment of the present invention.

Referring to FIG. 13, a wafer fragment 10f is illustrated. Wafer fragment 10f comprises a substrate 12f, and conductive electrical components 14f, 16f, 18f and 40f overlying substrate 12f. An insulative material 32f overlies components 14f, 16f, 18f, 40f, and substrate 12f. Wafer fragment 10f is similar to the wafer fragment 10e of FIG. 12, and may be formed by similar methods. Wafer fragment 10f differs from the wafer fragment 10e of FIG. 12 in that wafer fragment 10f comprises a matrix 34f of partially vaporized material. Matrix 34f can be formed from the mass 30e of FIG. 11 utilizing methods discussed above with reference to FIG. 6. Matrix 34f comprises voids 36f.

Wafer fragment 10f further comprises spacers 42f adjacent conductive elements 14f, 18f and 40f, with spacers 42f comprising matrix 34f and at least one void 36f.

It is noted that in forming the fifth embodiment of FIG. 13, material 32f may be formed either before or after formation of matrix 34f.

A sixth embodiment of the present invention is described with reference to FIG. 14. In describing the sixth embodiment, like numerals from the preceding discussion of the first five embodiments are utilized where appropriate, with differences being indicated by the suffix "g" or by different numerals.

Referring to FIG. 14, a wafer fragment 10g is illustrated. Wafer fragment 10g comprises a substrate 12g and conductive elements 50, 52, 54, 56, 58, 60, 62 and 64. Unlike the first five embodiments, the sixth embodiment of FIG. 14 comprises conductive elements which are vertically displaced from one another, for example, elements 50, 52 and 54, as well as conductive elements which are horizontally displaced from each other, for example, conductive elements 54, 56 and 58. Over conductive elements 52, 54, 56, 58, 60, 62 and 64 is a gas permeable insulative layer 32g.

Wafer fragment 10g further comprises voids 36g adjacent and between conductive elements 50, 52, 54, 56, 58, 60, 62 and 64. Voids 36g may be formed utilizing the methods discussed above regarding the first five embodiments of the invention. For example, voids 36g may be formed by providing a mass, analogous to mass 30c of FIG. 7, adjacent and between conductive elements 50, 52, 54, 56, 58, 60, 62 and 64, and subsequently substantially totally vaporizing the mass to form voids 36g. Alternatively, voids 36g could be formed within a matrix (not shown) analogous to matrix 34 of FIG. 6 utilizing methods such as those discussed above with reference to FIGS. 6 and 13. For instance, a mass analogous to mass 30 of FIG. 5 may be formed adjacent and between conductive elements 50, 52, 54, 56, 58, 60, 62 and 64 and subsequently partially vaporized to form a matrix adjacent and between the conductive elements.

Wafer fragment 10g further comprises support members 70, 72, 74, 76 and 78. Support members 70, 72, 74, 76 and 78 may be formed by methods analogous to the methods discussed above for forming support member 38 with reference to FIG. 9. Support members 70, 72, 74, 76 and 78 preferably comprise sizes and shapes analogous to conductive elements formed at a common elevational level with the support members. Accordingly, support members 70 preferably comprise sizes and shapes analogous to that of conductive element 50; support members 72 preferably comprise sizes and shapes analogous to that of conductive element 52; support members 74 preferably comprise sizes and shapes analogous to those of conductive elements 54, 56 and 58; support members 76 preferably comprise sizes and shapes similar to that of conductive element 60; and support members 78 preferably comprise sizes and shapes similar to those of conductive elements 62 and 64. Such advantageous similarity of the sizes and shapes of support members with sizes and shapes of conductive elements at similar elevational levels to the support members can advantageously assist in maintaining a substantially planar upper layer 32g.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a material adjacent a conductive electrical component comprising:

providing the conductive electrical component over a substrate surface;

depositing a material onto the substrate and adjacent the conductive electrical component, the depositing comprising spinning on an initial material onto the substrate;

anisotropically etching the material to form a spacer adjacent the conductive electrical component, the spacer comprising the material, a portion of the substrate surface laterally adjacent the spacer being exposed by the anisotropically etching;

forming a layer of insulative material overlying the spacer and overlying the conductive electrical component; and while the layer of insulative material overlies the spacer and the conductive electrical component, at least partially vaporizing the material.

2. The method of claim 1, where the initial material comprises two solvents, one of the solvents being more volatile than the other, the more volatile solvent being substantially removed by evaporation during the depositing of the material, and the other solvent substantially remaining, the other solvent being substantially removed from the material as the material is at least partially vaporized, the removing of the other solvent providing the forming of at least one void.

3. The method of claim 1, where the material is substantially totally vaporized.

4. The method of claim 1, where the forming of the layer over the spacer comprises forming the layer before at least partially vaporizing the mass.

5. The method of claim 1 wherein the material comprises polyimide or photoresist.

6. The method of claim 1 wherein the material is only partially vaporized to leave a matrix adjacent the conductive electrical component, the matrix having at least one void within it.

7. A method of forming an insulative spacer adjacent an electrical component comprising:

providing an electrical component disposed over a substrate surface;

providing a material adjacent the electrical component;

anisotropically etching the material to form a spacer shape comprising the material and expose a portion of the substrate surface;

forming a layer of insulative material over the anisotropically etched material and over the electrical component; and while the insulative material is over the electrical component and the spacer, at least partially vaporizing the material to form at least one void between the layer and the electrical component, the at least partially vaporized material and the at least one void together being comprised by an insulative spacer adjacent the electrical component.

8. The method of claim 7 wherein the insulative material comprises silicon dioxide.

9. The method of claim 7 wherein the material comprises carbon.

10. The method of claim 7 wherein the material is substantially totally vaporized.

11. The method of claim 7 wherein the material is only partially vaporized.

12. The method of claim 7 wherein the material comprises polyimide or photoresist.

13. The method of claim 7 wherein the material comprises $SiC_x$, wherein x is from about 0.2 to about 1.5.

14. The method of claim 7 wherein the providing the material comprises a spin-on-wafer technique.

15. The method of claim 7 wherein the providing the material comprises a vapor deposition technique.

* * * * *

UNITED STATES PATENT AND TRADEMARK OFFICE
CERTIFICATE OF CORRECTION

PATENT NO.       : 7,112,542 B2                                         Page 1 of 1
APPLICATION NO.  : 10/330719
DATED            : September 26, 2006
INVENTOR(S)      : Juengling et al.

It is certified that error appears in the above-identified patent and that said Letters Patent is hereby corrected as shown below:

Column 1, Line 10 – Replace "6,812,106" with --6,812,160--.

Column 1, Line 63 – Delete ":" after "have".

Column 2, Line 14 – Replace "can e" with --can have--.

Column 2, Line 65 – Replace "to second" with --to the second--.

Column 4, Line 55 – Replace "profile" with --provide--.

Column 5, Line 52 – Replace "invention discussed" with --invention (discussed--.

Column 6, Line 15 – Replace "of W" with --of the--.

Column 7, Line 32 – Replace "anisotropically mass" with --anisotropically etching--.

Signed and Sealed this

Twenty-sixth Day of June, 2007

JON W. DUDAS
*Director of the United States Patent and Trademark Office*